(12) United States Patent
Choi et al.

(10) Patent No.: US 10,518,515 B2
(45) Date of Patent: Dec. 31, 2019

(54) LAMINATING APPARATUS AND METHOD OF FABRICATING DISPLAY DEVICE USING THE SAME

(71) Applicant: Samsung Display Co., Ltd., Yongin-si, Gyeonggi-do (KR)

(72) Inventors: Sang Hee Choi, Cheonan-si (KR); Yang Han Son, Cheonan-si (KR); So Hyun Kim, Cheonan-si (KR)

(73) Assignee: Samsung Display Co., Ltd. (KR)

( * ) Notice: Subject to any disclaimer, the term of this patent is extended or adjusted under 35 U.S.C. 154(b) by 109 days.

(21) Appl. No.: 15/689,625

(22) Filed: Aug. 29, 2017

(65) Prior Publication Data

US 2018/0056638 A1    Mar. 1, 2018

(30) Foreign Application Priority Data

Aug. 30, 2016 (KR) .................. 10-2016-0111041

(51) Int. Cl.
| | | |
|---|---|---|
| *B32B 37/10* | (2006.01) | |
| *B32B 37/00* | (2006.01) | |
| *H01L 27/12* | (2006.01) | |
| *B32B 38/18* | (2006.01) | |

(Continued)

(52) U.S. Cl.
CPC ............ *B32B 37/10* (2013.01); *B32B 37/003* (2013.01); *B32B 37/0046* (2013.01); *B32B 38/1808* (2013.01); *H01L 27/1262* (2013.01); *B32B 38/1866* (2013.01); *B32B 2457/14* (2013.01); *B32B 2457/20* (2013.01); *B32B 2457/202* (2013.01); *B32B 2457/206* (2013.01); *B32B 2457/208* (2013.01); *G02F 1/1303* (2013.01); *G02F 2001/133331* (2013.01); *H01L 2251/5338* (2013.01)

(58) Field of Classification Search
CPC ............. B32B 38/1866; B32B 37/003; B32B 2457/20; B32B 2457/202; B32B 2457/206; B32B 2457/208; B32B 37/0046; H01L 2251/5338; G02F 1/1303; G02F 2001/133331
See application file for complete search history.

(56) References Cited

U.S. PATENT DOCUMENTS

2013/0312907 A1 * 11/2013 Oh ..................... B32B 38/1858
156/285
2016/0202728 A1    7/2016 Kim

FOREIGN PATENT DOCUMENTS

| CN | 103426774 A | 12/2013 |
|---|---|---|
| KR | 10-1578442 B1 | 12/2015 |
| KR | 101578442 B1 * | 12/2015 |

(Continued)

OTHER PUBLICATIONS

Chinese Office Action Report, Application No. 201710760289.0 dated Aug. 15, 2019, 9 pages.

*Primary Examiner* — Carson Gross
(74) *Attorney, Agent, or Firm* — Innovation Counsel LLP

(57) ABSTRACT

A laminating apparatus and method of fabricating a display device are provided. According to an exemplary embodiment of the present disclosure, the laminating apparatus includes a first jig, which is configured to fix a window having curved surfaces, and a second jig, which includes a pressure pad facing the first jig. The pressure pad includes a top surface, which is convex toward the first jig, and depressed portions, which are inwardly depressed from side surfaces, respectively.

19 Claims, 21 Drawing Sheets

(51) Int. Cl.
*G02F 1/13* (2006.01)
*G02F 1/1333* (2006.01)

(56) References Cited

FOREIGN PATENT DOCUMENTS

| | | |
|---|---|---|
| KR | 10-1588600 B1 | 1/2016 |
| KR | 10-2016-0013472 A | 2/2016 |
| KR | 10-2016-0087984 A | 7/2016 |

* cited by examiner

LAMINATING APPARATUS AND METHOD OF FABRICATING DISPLAY DEVICE USING THE SAME

This application claims priority to Korean Patent Application No. 10-2016-0111041, filed on Aug. 30, 2016, and all the benefits accruing therefrom under 35 U.S.C. § 119, the disclosure of which is incorporated herein by reference in its entirety.

BACKGROUND

1. Field

The present disclosure relates to a laminating apparatus and a method of fabricating a semiconductor device using the same.

2. Description of the Related Art

A flexible display device having a flexible substrate that is light in weight, robust against shock and formed of a material such as a plastic material has been developed. The flexible display device is foldable or rollable, is easy to carry around, and can thus be applied in various fields.

The flexible display device includes a display device formed on a flexible substrate. Examples of the display device include an organic light-emitting display device, a liquid crystal display (LCD) device, and the like.

These types of display devices generally include thin-film transistors (TFTs). Thus, the flexible substrate is inevitably subjected to several thin-film processes. Once the thin-film processes are complete, the flexible substrate is encapsulated by an encapsulation layer. The flexible substrate, the TFTs formed on the flexible substrate, and the encapsulation layer form a display panel of a display device together.

In general, a cover window is attached onto the front of the display panel to protect the display panel. A binder is inserted between the display panel and the cover window, and thus, the display panel and the cover window are bonded together.

A side-view display device, including a main display area in which a main image is displayed and an auxiliary display area which is provided on a side of the display device that is bent and in which a sub-image is displayed, has been developed. The cover window of the side-view display device has a bent structure on a side thereof.

SUMMARY

Exemplary embodiments of the present disclosure provide a laminating apparatus capable of providing a uniform bonding between a window and a panel.

Exemplary embodiments of the present disclosure also provide a laminating apparatus that does not allow an air layer to be inserted between a window and a panel.

Exemplary embodiments of the present disclosure also provide a method of fabricating a display device, which is capable of providing a uniform bonding between a window and a panel.

Exemplary embodiments of the present disclosure also provide a method of fabricating a display device, which does not allow an air layer to be inserted between a window and a panel.

However, exemplary embodiments of the present disclosure are not restricted to those set forth herein. The above and other exemplary embodiments of the present disclosure will become more apparent to one of ordinary skill in the art to which the present disclosure pertains by referencing the detailed description of the present disclosure given below.

According to an exemplary embodiment of the present disclosure, a laminating apparatus includes a first jig, which is configured to fix a window having curved surfaces; and a second jig, which includes a pressure pad facing the first jig, wherein the pressure pad includes a top surface, which is convex toward the first jig, and depressed portions, which are inwardly depressed from side surfaces, respectively.

The window may include a flat surface and curved surfaces, which are disposed at both sides of the flat surfaces.

The curved surfaces may extend in a longitudinal direction, and the depressed portions may extend in the longitudinal direction to correspond with the curved surfaces.

The laminating apparatus may further include a panel disposed on the second jig.

The laminating apparatus may further include stoppers configured to be disposed between ends of the panel and ends of the window.

The stoppers may be configured to push the ends of the panel inwardly such that the ends of the panel are located on inner sides of the depressed portions, respectively.

The stoppers may include body portions, respectively, and hand portions, respectively, which extend from the body portions, and a coating layer may be disposed on each of the hand portions.

The laminating apparatus may further include panel supports configured to be disposed on both sides of the panel.

The panel supports may be configured to bend the panel by pushing the ends of the panel inwardly.

The laminating apparatus may further include a stage on which the pressure pad is disposed.

The pressure pad and the stage may be disposed in one body with each other.

The pressure pad may further include protruding portions, which are disposed on the outer sides of the side surfaces, respectively.

The laminating apparatus may further include first and second chambers containing the first and second jigs, respectively.

The first and second chambers may be configured to be coupled to each other and may form a sealed space together.

The window may include a flat surface and first, second, third, and fourth curved surfaces, which are disposed on the sides of the flat surface.

The depressed portions may include depression lines, and the depression lines may form a closed polygonal shape in a plan view.

The window may further include four connecting curved surfaces, which connect the first, second, third, and fourth curved surfaces.

The depressed portions may be disposed at corners, respectively, of the pressure pad to correspond with the four connecting curved surfaces.

The laminating apparatus may further include first, second, third, and fourth stoppers disposed adjacent to the four connecting curved surfaces.

The laminating apparatus may further include first, second, third, and fourth stoppers disposed to correspond with the first, second, third, and fourth curved surfaces, respectively.

According to another exemplary embodiment of the present disclosure, a method of fabricating a display device includes: preparing a first jig, which fixes a window, a second jig, which includes a pressure pad facing the first jig and having a top surface that is convex and depressed portions that are inwardly depressed from side surfaces, respectively, and a panel, which is disposed on the second jig; gradually bonding the window and the panel by applying pressure to the panel with the pressure pad; inserting stoppers between the window and the panel to separate ends of the window and ends of the panel from each other; and gradually bonding the window and the panel by applying pressure to the panel with the pressure pad with the ends of the window and the ends of the panel spaced apart from each other.

The method may further include bending the panel by pushing the ends of the panel inwardly with panel supports.

According to exemplary embodiments of the present disclosure, a uniform bonding can be provided between a window and a panel both having curved surfaces.

Also, an air layer can be prevented from being inserted between a window and a panel both having curved surfaces.

Other features and exemplary embodiments may be apparent from the following detailed description, the drawings, and the claims.

BRIEF DESCRIPTION OF THE DRAWINGS

The above and other exemplary embodiments and features of the present disclosure will become more apparent by describing in detail exemplary embodiments thereof with reference to the attached drawings, in which.

DETAILED DESCRIPTION

Figure 1:
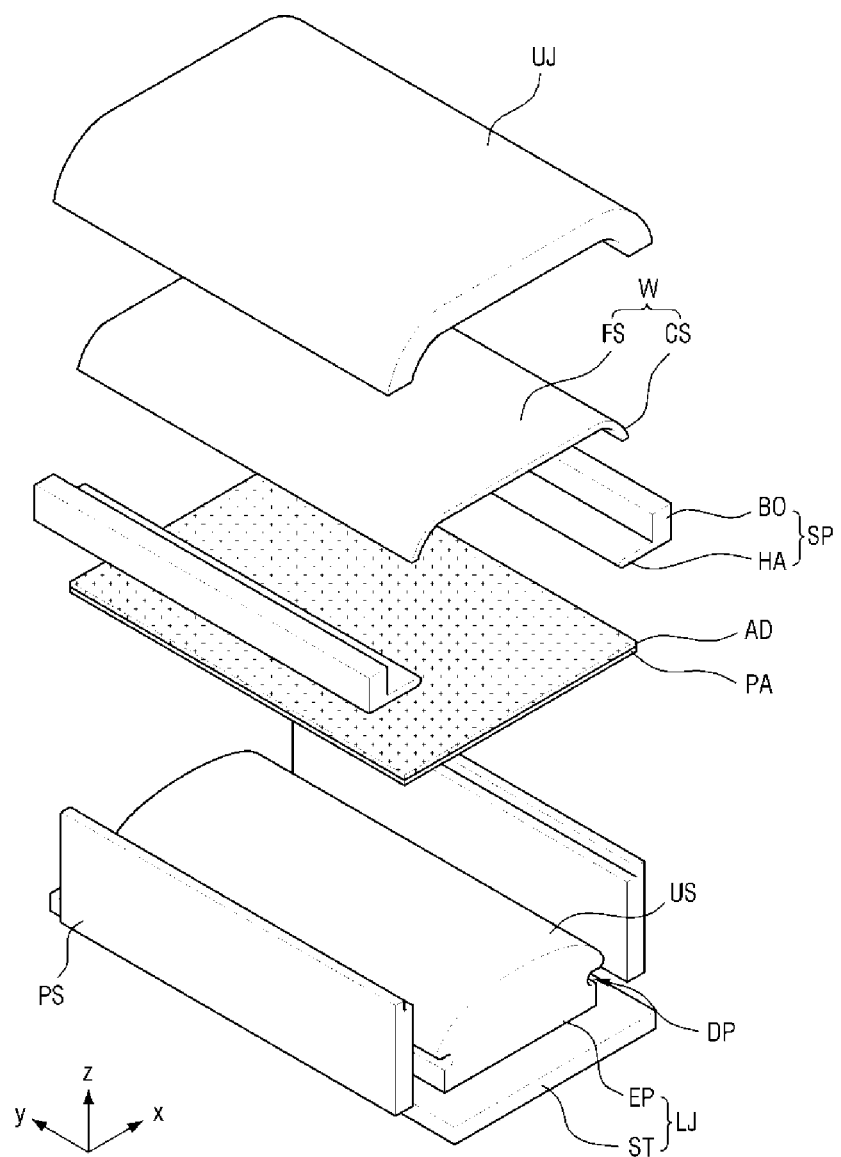
FIG. 1 is a perspective view of a laminating apparatus according to an exemplary embodiment of the present disclosure.

The aspects and features of the inventive concept and methods for achieving the aspects and features will be apparent by referring to the embodiments to be described in detail with reference to the accompanying drawings. However, the inventive concept is not limited to the embodiments disclosed hereinafter, but can be implemented in diverse forms. The matters defined in the description, such as the detailed construction and elements, are nothing but specific details provided to assist those of ordinary skill in the art in a comprehensive understanding of the inventive concept, and the inventive concept is only defined within the scope of the appended claims.

The term "on" that is used to designate that an element is on another element or located on a different layer or a layer includes both a case where an element is located directly on another element or a layer and a case where an element is located on another element via another layer or still another element. In the entire description of the inventive concept, the same drawing reference numerals are used for the same elements across various figures.

Although the terms "first, second, and so forth" are used to describe diverse constituent elements, such constituent elements are not limited by the terms. The terms are used only to discriminate a constituent element from other constituent elements. Accordingly, in the following description, a first constituent element may be a second constituent element.

Hereinafter, embodiments will be described with reference to the attached drawings.

Figure 2:
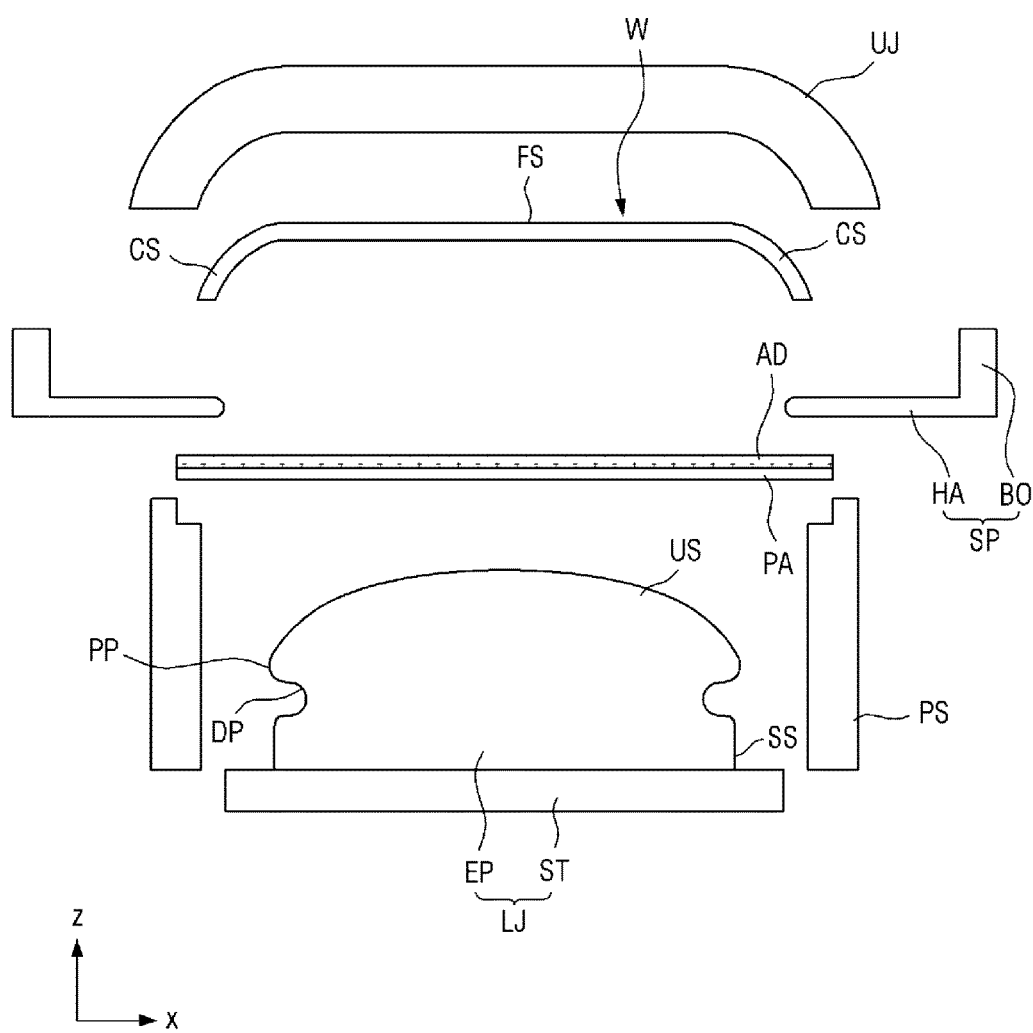
FIG. 2 is a cross-sectional view of the laminating apparatus according to the exemplary embodiment of FIG. 1.

FIG. 1 is a perspective view of a laminating apparatus according to an exemplary embodiment of the present disclosure. FIG. 2 is a cross-sectional view of the laminating apparatus according to the exemplary embodiment of FIG. 1.

Referring to FIGS. 1 and 2, the laminating apparatus according to the present exemplary embodiment includes a first jig UJ, which fixes a window W, and a second jig LJ, which includes a pressure pad EP facing the first jig UJ and having a top surface US that is convex and depressed portions DP that are inwardly depressed from side surfaces SS, respectively.

The first jig UJ may fix the window W. In an exemplary embodiment, the first jig UJ may fix the window W using a vacuum lift or bonding method.

In an exemplary embodiment, the first jig UJ may be, but is not limited thereto, a top jig disposed at the top of the laminating apparatus according to the present exemplary embodiment. In an alternative exemplary embodiment, the first jig UJ may be a bottom jig disposed at the bottom of the laminating apparatus according to the present exemplary embodiment.

Part of the first jig UJ that is placed in contact with the window W may have a shape corresponding to the window W. For example, in a case in which the window W has a flat surface and curved surfaces, the first jig UJ may have a flat portion and curved portions accordingly. More specifically, in an example in which the window W has a flat surface FS and curved surfaces CS on both sides of the flat surface FS, the first jig UJ may have a flat portion and curved portions to conform to the shape of the window W.

In an exemplary embodiment, the first jig UJ may be vertically movable. In other words, the first jig UJ may move in a positive Z-axis direction or a negative Z-axis direction.

The window W may be formed of transparent glass or plastic. In other words, the window W may be formed of a light-transmissive material.

In an exemplary embodiment, the window may be flexible. In other words, the window W may be formed of a bendable, foldable, or rollable material or may thus be bendable, foldable, or rollable.

In an exemplary embodiment, the top surface of the window W may be placed in contact with the first jig UJ and may thus be fixed to the first jig UJ. The window W may have the curved surfaces CS, at least in parts thereof. The window W will be described later in detail with reference to FIGS. 4 and 5.

Stoppers SP may be provided at both sides of the window W. The stoppers SP may be disposed between the ends of the window W and the ends of a panel PA and may guide the window W and the panel PA to be bonded gradually. The operation of the stoppers SP will be described later in detail.

The stoppers SP may be bar-shaped and may extend in a longitudinal direction. In an example in which the window W includes the curved surfaces CS extending in the longitudinal direction, the stopper SP may also extend in the same longitudinal direction as the curved surfaces CS of the window W. That is, the stoppers SP may be disposed to correspond with the curved surfaces CS of the window W.

The stoppers SP may be horizontally movable. In an exemplary embodiment, the stoppers SP may move in a positive X-axis direction or a negative X-axis direction. More specifically, the two stoppers SP may move close to, or away from, each other.

The stoppers SP include body portions BO, respectively, and hand portions HA, respectively, which extend from the body portions BO. The hand portions HA may be relatively thinner than the body portions BO. The hand portions HA may be interposed between the window W and the panel PA and may guide the bonding between the window W and the panel PA.

The ends of the hand portions HA may be curved. In other words, the outer circumferences of the ends of the hand portions HA may be at least partially curved. In a case in which the ends of the hand portions HA are curved, the contact area between the stoppers SP and the panel PA and/or the contact area between the stoppers SP and an adhesive layer AD that will be described later may be minimized, and thus, a "chafing" phenomenon that may be caused by the contact between the stoppers SP and the panel PA and/or between the stoppers SP and the adhesive layer AD may be prevented.

The second jig LJ may be disposed to face the first jig UJ. In an exemplary embodiment, the second jig LJ may be a bottom jig disposed below the first jig UJ. For convenience, an example in which the first and second jigs UJ and LJ are disposed at the top and the bottom, respectively, of the laminating apparatus according to the present exemplary embodiment will hereinafter be described, but the present disclosure is not limited to this example. That is, in another example, the first and second jigs UJ and LJ may be disposed at the bottom and the top, respectively, of the laminating apparatus according to the present exemplary embodiment.

The second jig UJ may include a stage ST and the pressure pad EP, which is disposed on the stage ST.

The stage ST may provide room for the pressure pad EP. The stage ST may be vertically movable. For example, the stage ST may move in the positive Z-axis direction or the negative Z-axis direction.

Since the stage ST is vertically movable, the pressure pad EP may also be vertically movable.

The pressure pad EP may be disposed on the stage ST. In an exemplary embodiment, the pressure pad EP may be coupled to the stage ST. In another exemplary embodiment, the pressure pad EP may be formed of the same material as, and in one body with, the stage ST.

The pressure pad EP may be elastic and may be at least partially deformable. In other words, the pressure pad EP may be formed of an elastic material. For example, the pressure pad EP may comprise at least one selected from the group consisting of urethane, rubber, and a synthetic resin, but the material of the pressure pad EP is not particularly limited. That is, any elastic material may be used as the material of the pressure pad EP.

In an exemplary embodiment, the pressure pad EP may be formed in one piece. In other words, the pressure pad EP may be formed of a single material.

In an exemplary embodiment, the density of the pressure pad EP may be uniform throughout the entire pressure pad EP. In other words, the mass of an elastic material per unit volume of the pressure pad EP may be the same on the inside and the outside of the pressure pad EP, or from one part to another part of the pressure pad EP.

In a case in which the density of the pressure pad EP is uniform throughout the entire pressure pad EP, the magnitude of pressure applied by the pressure pad EP may be determined only by the shape of the pressure pad EP.

The shape of the pressure pad EP will be described later with reference to FIG. 5.

The depressed portions DP may be formed on at least one side of the pressure pad EP. In an exemplary embodiment, the depressed portions DP may be formed on both sides of the pressure pad EP.

The depressed portions DP may extend in the longitudinal direction. In other words, the depressed portions DP may extend in a Y-axis direction.

In an exemplary embodiment, the depressed portions DP may extend in the same longitudinal direction as the curved surfaces CS of the window W. That is, the depressed portions DP may be disposed to correspond with the curved surfaces CS of the window W.

Panel supports PS may be disposed on both sides of the second jig UJ. The panel supports PS may support both sides of the panel PA. In an exemplary embodiment, the panel supports PS may be movable in a positive X-axis direction or a negative X-axis direction. That is, the panel supports PS may move close to, or away from, each other. As will be described later in detail, the panel PA may be bent in an arch shape in response to the panel supports PS moving close to each other while supporting both sides of the panel PA.

In an exemplary embodiment, the panel PA may be a display panel or a touch screen panel (TSP). In another exemplary embodiment, the panel PA may be a touch unit. However, the present disclosure is not limited to these exemplary embodiments, and the panel PA may be interpreted in its broadest sense. That is, the panel PA may be interpreted as a plate-shaped member.

The adhesive layer AD may be disposed on the panel PA. The adhesive layer AD may be interposed between the window W and the panel PA and may bond the window W and the panel PA together.

In an exemplary embodiment, the adhesive layer AD may comprise a photocurable resin or a thermosetting resin having high transmissivity and adhesiveness. For example, the adhesive layer AD may be formed by applying a resin such as an acrylic resin and applying ultraviolet (UV) light to cure the resin.

In another exemplary embodiment, the adhesive layer AD may comprise an optically clear adhesive (OCA).

The adhesive layer AD is illustrated as completely covering the panel PA, but the present disclosure is not limited thereto. Alternatively, the adhesive layer AD may at least partially cover the panel PA.

For convenience, an example in which the adhesive layer AD is formed on the panel PA will hereinafter be described, but the present disclosure is not limited to this example. That is, in another example, the adhesive layer AD may be formed below the window W.

Figure 3:
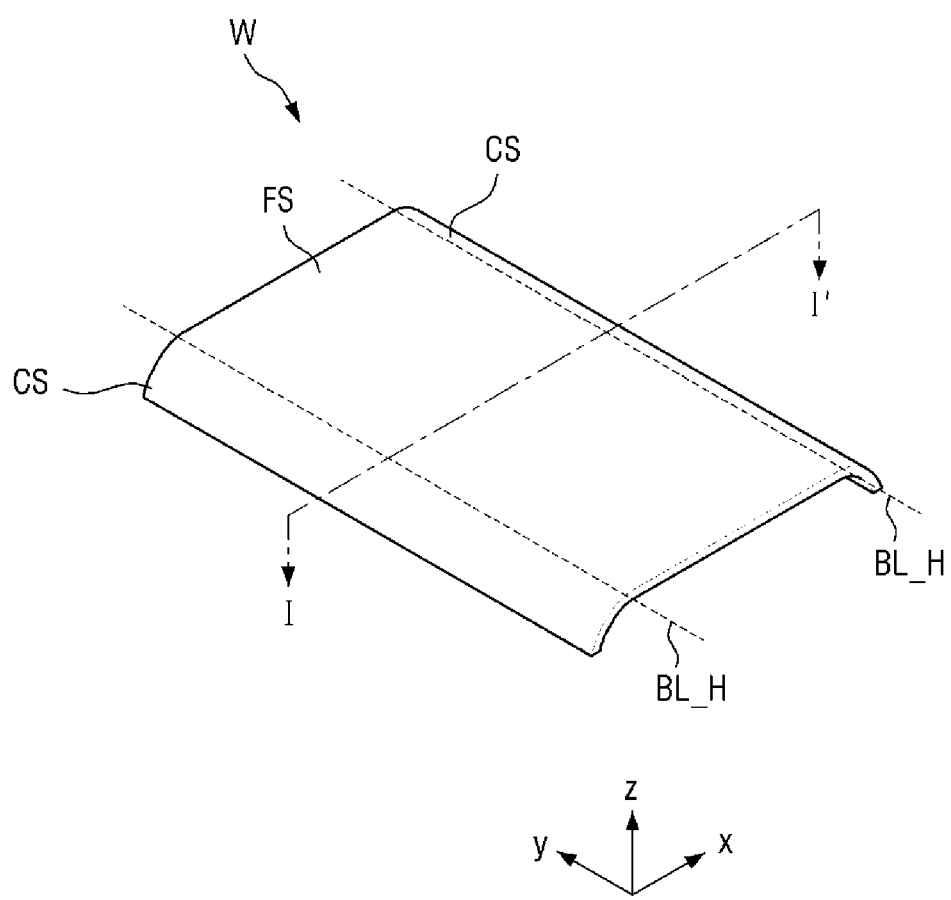
FIG. 3 is a partial perspective view of a laminating apparatus according to an exemplary embodiment of the present disclosure.

The window W will hereinafter be described with reference to FIGS. 3 and 4. FIG. 3 is a partial perspective view of a laminating apparatus according to an exemplary embodiment of the present disclosure.

Figure 4:
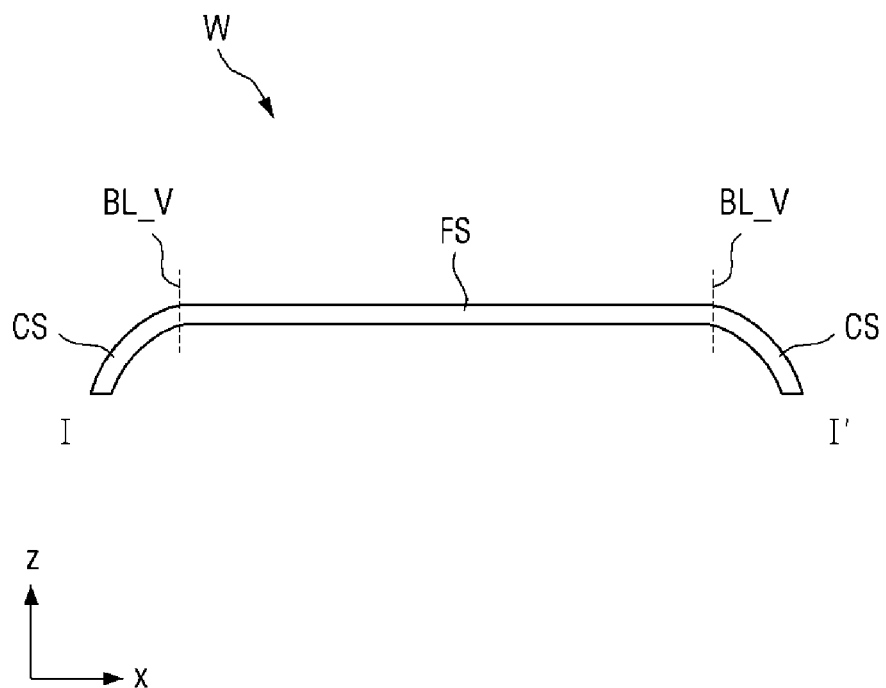
FIG. 4 is a cross-sectional view taken along line I-I' of FIG. 3.

FIG. 4 is a cross-sectional view taken along line I-I' of FIG. 3.

Referring to FIGS. 3 and 4, the window W may include the flat surface FS and the curved surfaces CS, which are disposed on both sides of the flat surface FS.

Boundaries may be formed between the flat surface FS and the curved surfaces CS. In other words, the flat surface FS and the curved surfaces CS may be defined by boundaries therebetween.

For convenience, horizontal boundaries BL_H and vertical boundaries BL_V may be defined as illustrated in FIGS. 3 and 4.

The horizontal boundaries BL_H may be defined as boundaries that separate the curved surfaces CS and the flat surface FS at the top surface of the window W. The horizontal boundaries BL_H may be provided on an XY plane, as illustrated in FIG. 3.

The vertical boundaries BL_V may be defined as boundaries that separate the curved surfaces CS and the flat surface FS at the bottom surface of the window W. The vertical boundaries BL_V may extend in a vertical direction, i.e., the Z-axis direction, and may be provided on a YZ plane, as illustrated in FIG. 4.

The pressure pad EP will hereinafter be described with reference to FIG. 5.

Figure 5:
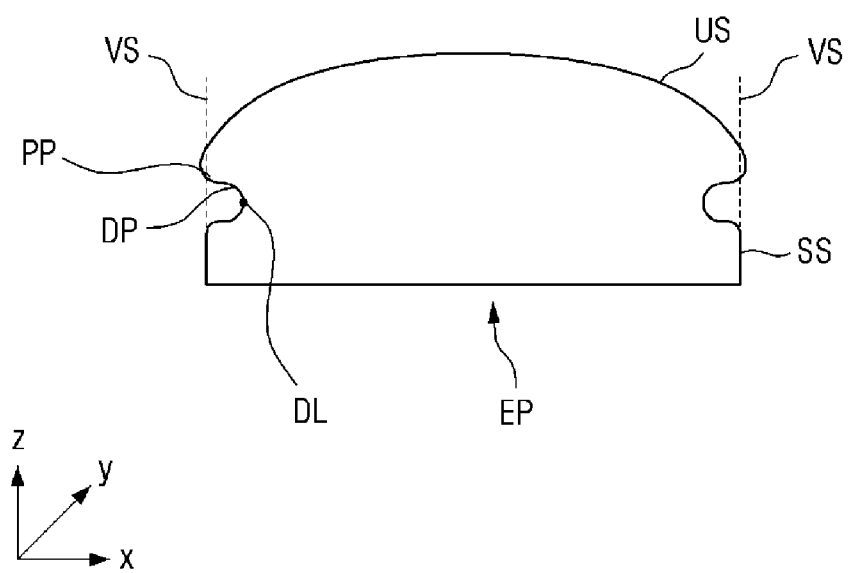
FIG. 5 is a partial cross-sectional view of a laminating apparatus according to an exemplary embodiment of the present disclosure.

FIG. 5 is a partial cross-sectional view of a laminating apparatus according to an exemplary embodiment of the present disclosure.

Referring to FIG. 5, the pressure pad EP may include the top surface US, the side surfaces SS, the depressed portions DP, and protruding portions PP.

The top surface US of the pressure pad EP may have a convex shape. More specifically, the top surface US of the pressure pad EP may have a convex parabolic shape. That is, the top surface US of the pressure pad EP may include inclined surfaces, the height of which gradually decreases from the center to either end of the pressure pad EP.

The side surfaces SS of the pressure pad EP may extend in the vertical direction, for example, the Z-axis direction.

For convenience, imaginary reference planes VS, which extend from the side surfaces SS, respectively, may be defined as surfaces extending vertically from the side surfaces SS, respectively.

The pressure pad EP may include the depressed portions DP, which are inwardly depressed from the side surfaces SS, respectively. The depressed portions DP may be depressed from the reference planes VS, respectively, by a predetermined distance. That is, the outer circumferences of the depressed portions DP may be located on the inner sides of the reference planes VS, respectively. Depression lines DL may be defined on the inside of the depressed portions DP, respectively. Each of the depression lines DL may be defined as a line connecting points on the innermost side of a corresponding depressed portion DP. That is, in an example in which the depressed portions DP extend in the longitudinal direction, the depression lines DL may also extend in the longitudinal direction along with the depressed portions DP.

The protruding portions PP may be disposed above the depressed portions DP. The protruding portions PP may be formed to protrude beyond the reference planes VS, respectively, by a predetermined distance. That is, the protruding portions PP may be located on the outer sides of the side surfaces SS, respectively.

As will be described later, the depressed portions DP and the protruding portions PP may affect the pressure applied to the panel PA or the window W. That is, due to the presence of the depressed portions DP, the pressure at the boundaries between the flat surface FS and the curved surfaces CS of the window W may relatively decrease, and due to the presence of the protruding portions PP, the pressure at the ends of the curved surfaces CS of the window W may relatively increase. Accordingly, the uniformity of the bonding between the window W and the panel PA may be improved.

The operation of a laminating apparatus according to an exemplary embodiment of the present disclosure will hereinafter be described with reference to FIGS. 6 through 13.

FIGS. 6 through 13 are cross-sectional views of a laminating apparatus according to an exemplary embodiment of the present disclosure.

Figure 6:
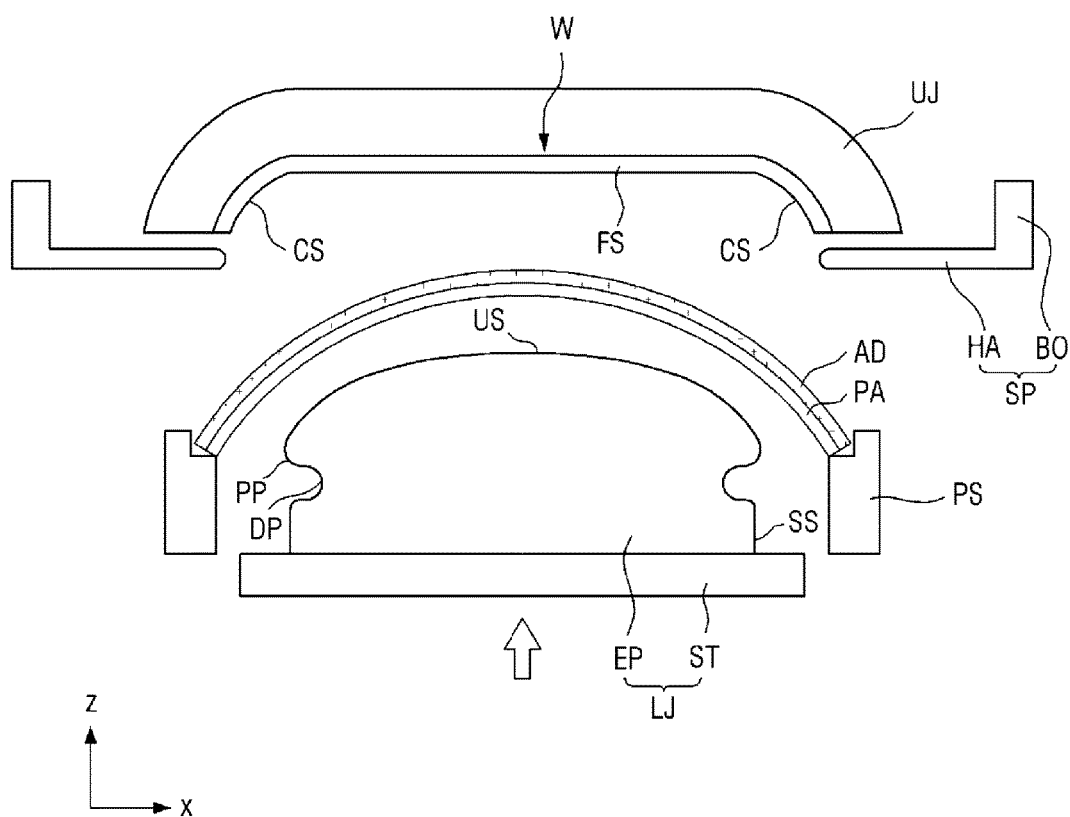
FIG. 6 is a cross-sectional view of a laminating apparatus according to an exemplary embodiment of the present disclosure.

Referring to FIG. 6, an initial state will hereinafter be described. The term "initial state", as used herein, may denote a state in which the panel PA is safely received on the panel supports PS, the window W and the adhesive layer AD are spaced apart from each other, and the panel PA and the pressure pad EP are spaced apart from each other.

In the initial state, the panel supports PS may support both ends of the panel PA and may move close to each other.

As the panel supports PS move close to each other, the panel PA may be bent into an arch shape. In other words, the panel PA may be bent into a convex parabolic shape.

A lamination process may be performed by allowing the first and second jigs UJ and LJ to move close to each other. That is, the first jig UJ may be lowered, the second jig LJ may be lifted, or the first and second jigs UJ and LJ may both be lowered or lifted so as for the first and second jigs UJ and LJ to move close to each other.

For convenience, an example in which the first jig UJ is fixed and the second jig LJ is lifted will hereinafter be described.

Figure 7:
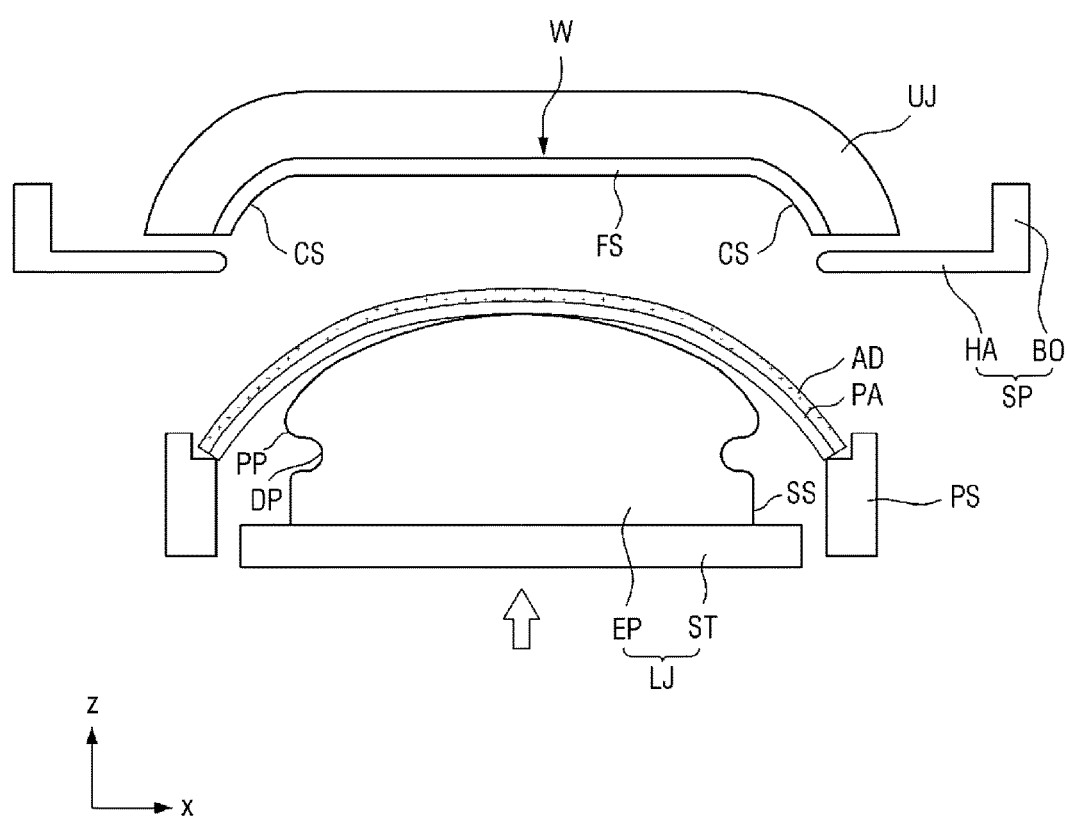
FIG. 7 is a cross-sectional view of a laminating apparatus according to an exemplary embodiment of the present disclosure.

Referring to FIG. 7, as the second jig LJ is lifted, the bottom surface of the panel PA and the pressure pad EP are placed in contact with each other. As mentioned above, the pressure pad EP may have elasticity and may be deformed by pressure applied thereto upon being placed in contact with the panel PA. That is, as the second jig LJ is lifted, the bottom surface of the panel PA and the pressure pad EP may be placed in surface contact with each other.

Figure 8:
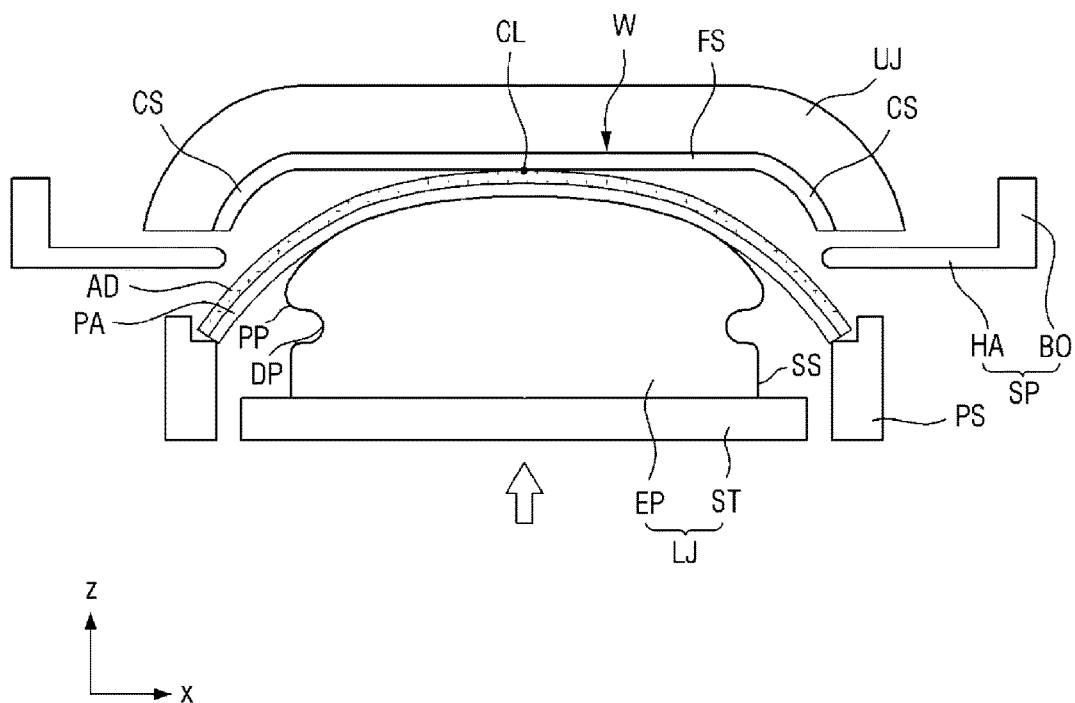
FIG. 8 is a cross-sectional view of a laminating apparatus according to an exemplary embodiment of the present disclosure.

Thereafter, referring to FIG. 8, as the second jig LJ, the panel supports PS, and the panel PA are lifted, the adhesive layer AD, which is disposed on the panel PA, and the window W are placed in contact in their middle parts first. In this case, the flat surface FS of the window W and the adhesive layer AD of the panel PA, which has a parabolic shape, may be placed in line contact with each other in their middle parts. In other words, a contact line CL may be formed at the window W and the adhesive layer AD.

Figure 9:
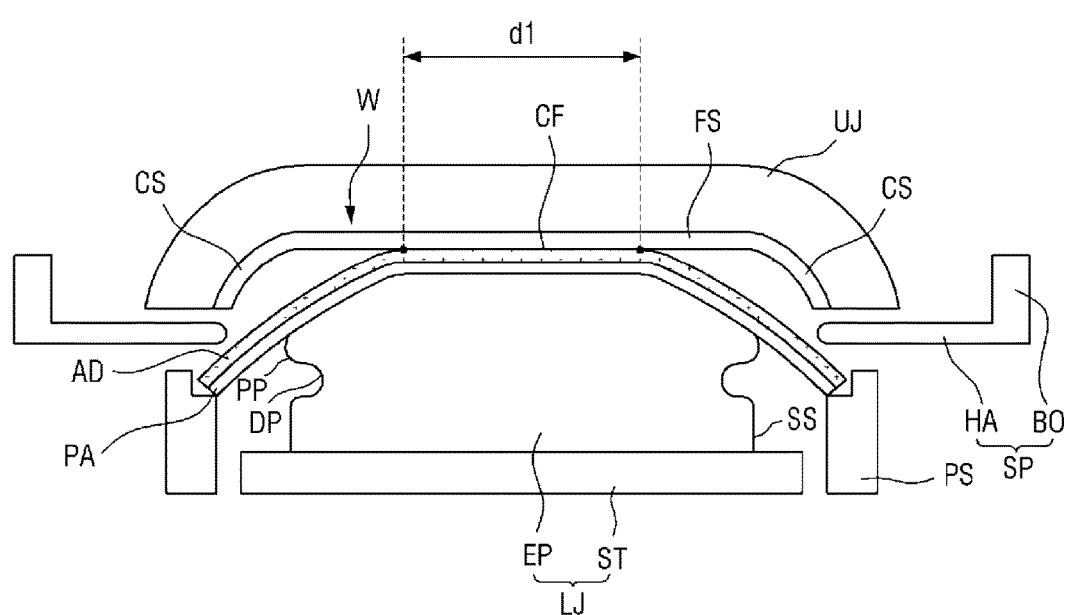
FIG. 9 is a cross-sectional view of a laminating apparatus according to an exemplary embodiment of the present disclosure.

Thereafter, referring to FIG. 9, as the second jig LJ, the panel supports PS, and the panel PA continue to be lifted, the area of contact between the window W and the adhesive layer AD may widen gradually from the contact line CL to either side of the contact line CL. In other words, the window W and the adhesive layer AD may be placed in surface contact with each other. That is, a contact surface CF may be formed where the window W and the adhesive layer AD contact each other. The window W and the panel PA may be bonded gradually from their centers to their edges.

In this case, the width of the contact surface CF may be the same as a first distance d1.

The first distance d1 may be smaller than the distance between the vertical boundaries BL_V.

Figure 10:
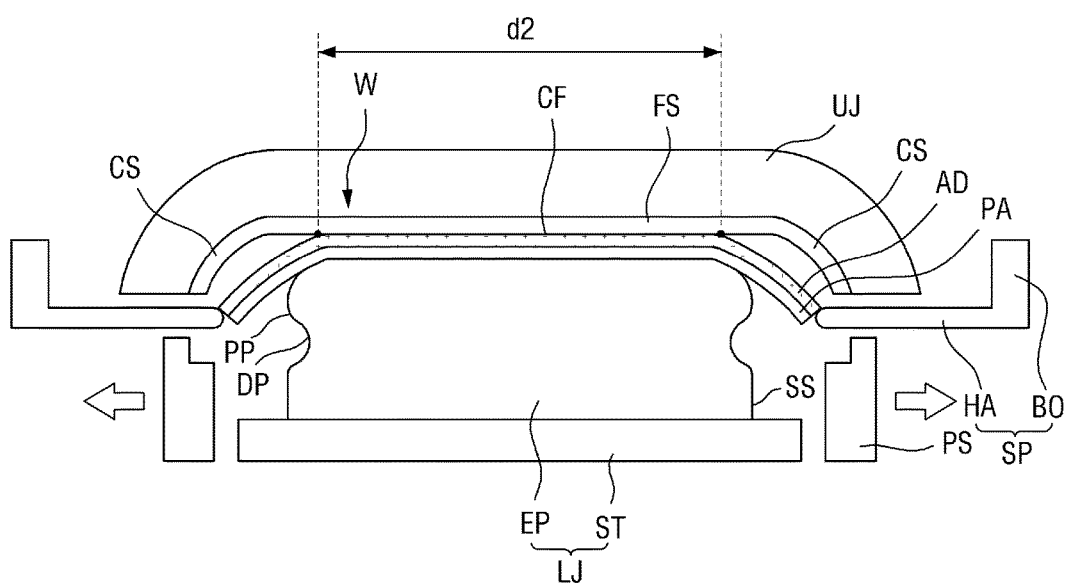
FIG. 10 is a cross-sectional view of a laminating apparatus according to an exemplary embodiment of the present disclosure.

Thereafter, referring to FIG. 10, as the panel supports PS move away from each other, the panel supports PS may be spaced apart from the panel PA. Accordingly, the force applied to the panel PA is eliminated, and as a result, both ends of the panel PA may be lifted by a predetermined distance. Both ends of the panel PA may be lifted to the extent that the panel PA may be placed in contact with the stoppers SP. More specifically, the panel PA or the adhesive layer AD may be placed in contact with the ends of the hand portions HA of the stoppers SP.

In this case, the width of the contact surface CF may be the same as a second distance d2, and the second distance d2 may be larger than the first distance d1.

An air layer may be prevented from being inserted between the panel PA and the window W, only if the panel PA and the window W are bonded gradually from their centers to their edges. Since the stoppers SP are disposed between the ends of the panel PA and the ends of the window W, the ends of the panel PA and the ends of the window W can be prevented from being placed in contact first so as to prevent the formation of an air layer between the panel PA and the window W.

That is, the stoppers SP may push both ends of the panel PA inwardly and may thus prevent the ends of the panel PA and the ends of the window W from being placed in contact first. That is, the stoppers SP may guide the panel PA and the window W to be bonded gradually from their centers to their edges.

Figure 11:
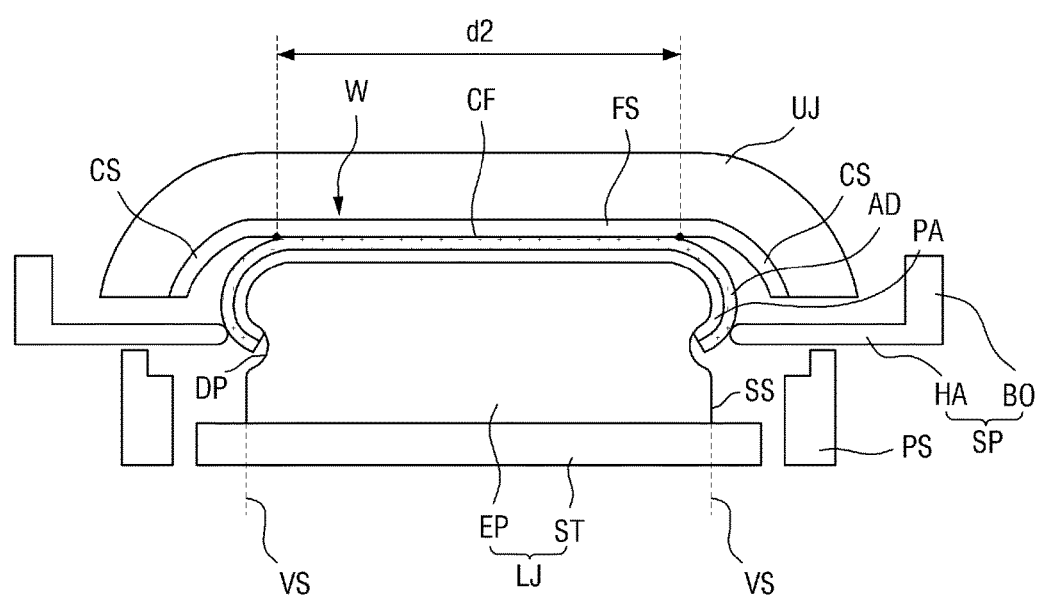
FIG. 11 is a cross-sectional view of a laminating apparatus according to an exemplary embodiment of the present disclosure.

FIG. 11 is a cross-sectional view of a laminating apparatus according to an exemplary embodiment of the present disclosure.

Referring to FIG. 11, in an exemplary embodiment, the stoppers SP may push the ends of the panel PA into the depressed portions DP, respectively. As a result, the ends of the panel PA may be located on the inner sides of the reference planes VS, respectively. If the stoppers SP push the ends of the panel PA into the depressed portions DP, respectively, the ends of the panel PA and the ends of the window W can be properly prevented from being placed in contact first.

Figure 12:
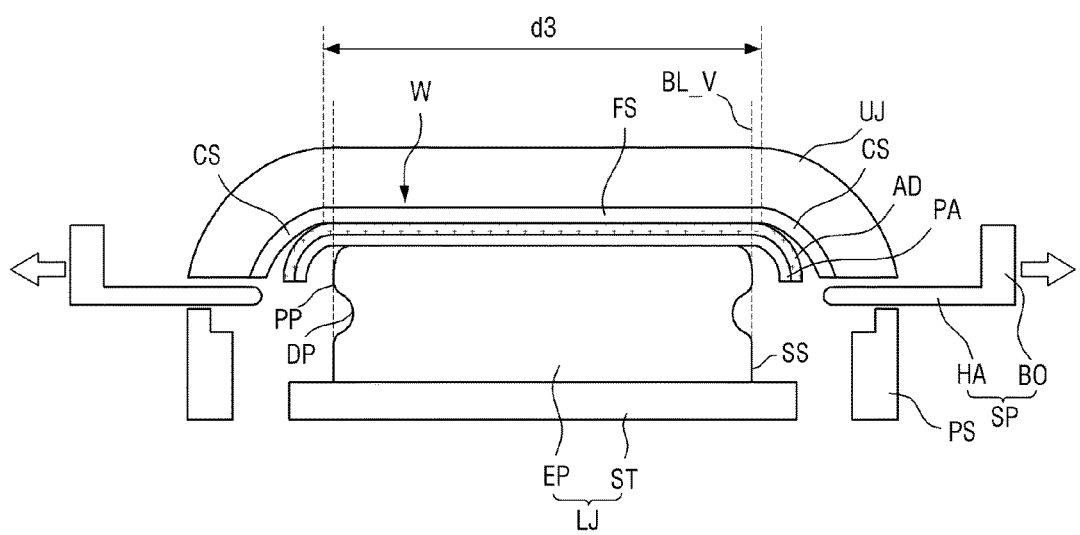
FIG. 12 is a cross-sectional view of a laminating apparatus according to an exemplary embodiment of the present disclosure.

Thereafter, referring to FIG. 12, as the second jig LJ continues to be lifted, the width of the contact surface CF may continue to increase and may thus become the same as a third distance d3. In an exemplary embodiment, the third distance d3 may be larger than the distance between the vertical boundaries BL_V. In this case, the curved surfaces CS of the window W and the adhesive layer AD may be gradually placed in contact with each other.

The pressure applied to the panel PA and the curved surfaces CS of the window W may be controlled by the depressed portions DP and the protruding portions PP. In an exemplary embodiment, the depressed portions DP may be disposed at locations corresponding to the vertical boundaries BL_V. In a case in which the depressed portions DP are disposed at the locations corresponding to the vertical boundaries BL_V, the pressure in parts of the curved surfaces CS near the vertical boundaries BL_V may become relatively lower than when the depressed portions DP are not provided. In general, if too much pressure is applied to the parts of the curved surfaces CS near the vertical boundaries BL_V, the adhesive layer AD may chafe, causing a defect. On the other hand, if the depressed portions DP are disposed at the locations corresponding to the vertical boundaries BL_V, the pressure in the parts of the curved surfaces CS near the vertical boundaries BL_V may be controlled, thereby preventing a defect.

In an exemplary embodiment, the protruding portions PP may be disposed to correspond with parts of the curved surfaces CS near the ends of the window W. In a case in which the protruding portions PP are disposed to correspond with the parts of the curved surfaces CS near the ends of the window W, the pressure in the parts of the curved surfaces CS near the ends of the window W may become relatively higher than when the protruding portions PP are not provided.

In general, if the pressure at the ends of the window W is not sufficiently high, the panel PA and the window W may be bonded improperly. In a case in which the protruding portions PP are disposed to correspond with the parts of the curved surfaces CS near the ends of the window W, the pressure at the ends of the window W may increase, and thus, a lamination defect may be prevented.

In an exemplary embodiment, once the contact between the curved surfaces CS and the adhesive layer AD begins, i.e., once the width of the contact surface CF becomes larger than the distance between the vertical boundaries BL_V, the stoppers SP may move away from each other and may thus be separated from the panel PA.

The movement of the stoppers SP and a lamination process may be performed at the same time or one after another. In an exemplary embodiment, the movement of the stoppers SP and the lifting of the second jig LJ may be performed at the same time. In another exemplary embodiment, the second jig LJ may be temporarily stopped at or after a particular time, and the stoppers SP may be removed. The particular time may be a time when the width of the contact surface CF continues to increase and eventually exceeds the distance between the vertical boundaries BL_V.

Figure 13:
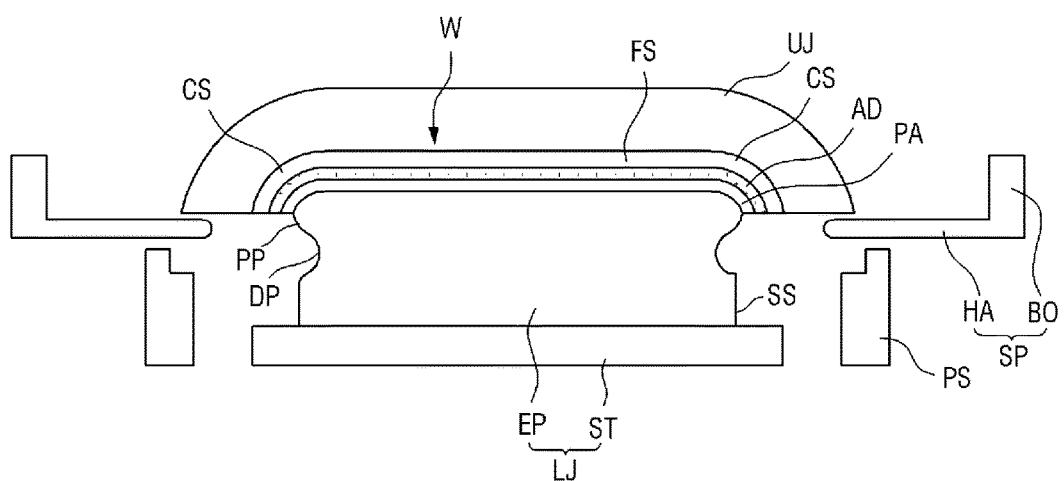
FIG. 13 is a cross-sectional view of a laminating apparatus according to an exemplary embodiment of the present disclosure.

Thereafter, referring to FIG. 13, the second jig LJ continues to be lifted until the entire lamination process may be completed. In this case, the window W, the panel PA, and the top surface US of the pressure pad EP may completely overlap with one another. Also, the top surface US of the pressure pad EP may include a flat portion and curved portions to conform to the shape of the window W or the panel PA.

A laminating apparatus according to another exemplary embodiment of the present disclosure will hereinafter be described.

Figure 14:
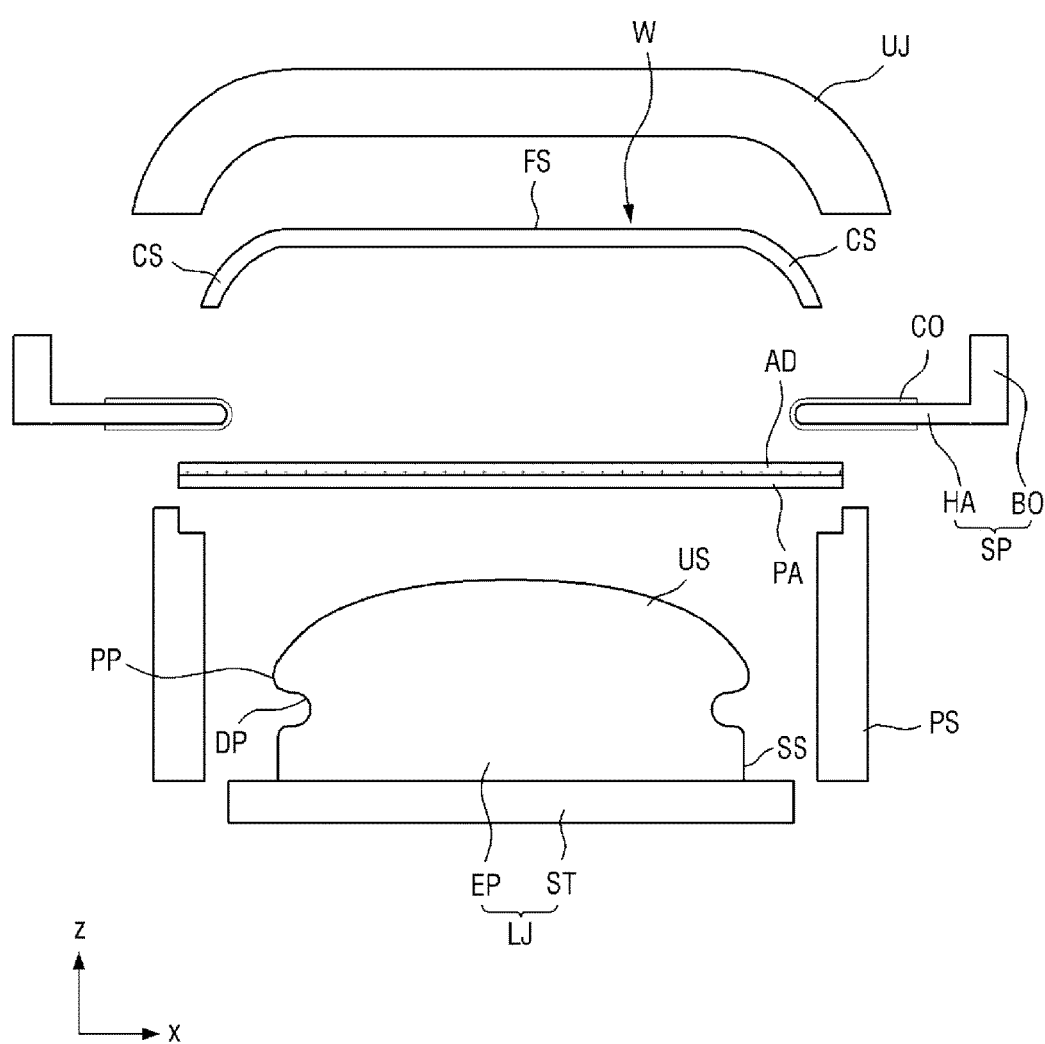
FIG. 14 is a cross-sectional view of a laminating apparatus according to an exemplary embodiment of the present disclosure.

FIG. 14 is a cross-sectional view of a laminating apparatus according to an exemplary embodiment of the present disclosure.

Referring to FIG. 14, the laminating apparatus according to the present exemplary embodiment differs from the laminating apparatus according to the exemplary embodiment of FIG. 2 in that a coating layer CO is formed on hand parts HA, sometimes called hand portions HA, of stoppers SP.

The coating layer CO may be formed on the hand parts HA of the stoppers SP. As mentioned above, the hand parts HA of the stoppers SP may be temporarily placed in contact with an adhesive layer AD, and if the adhesive force between the hand parts HA and the adhesive layer AD is too strong, the adhesive layer AD may be damaged or may chafe.

This problem may be addressed by forming the coating layer CO on the hand parts HA so as to reduce the adhesive force between the hand parts HA and the adhesive layer AD.

In an exemplary embodiment, the coating layer CO may be formed by spray coating, but the present disclosure is not limited thereto.

In an exemplary embodiment, the coating layer CO may be formed using at least one of a fluorine resin and silicone, but the present disclosure is not limited thereto.

In an exemplary embodiment, the coating layer CO may have a thickness of 30 μm to 100 μm.

Figure 15:
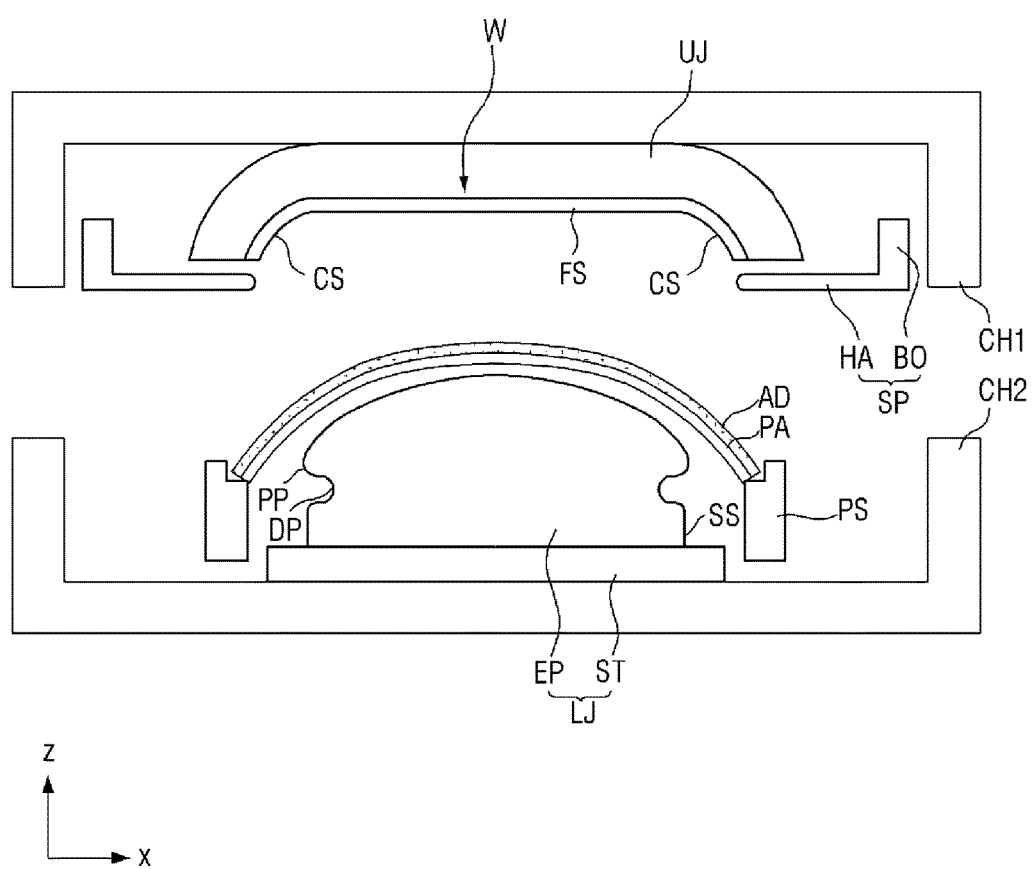
FIG. 15 is a cross-sectional view of a laminating apparatus according to an exemplary embodiment of the present disclosure.
Figure 16:
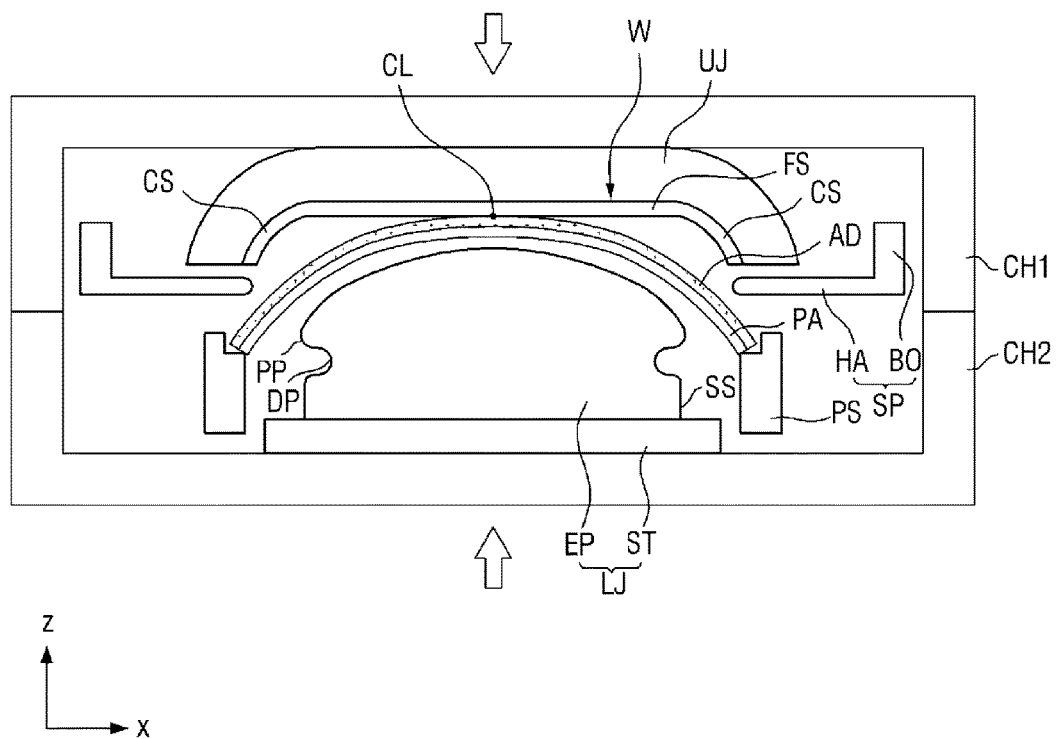
FIG. 16 is a cross-sectional view of a laminating apparatus according to an exemplary embodiment of the present disclosure.

FIGS. 15 and 16 are cross-sectional views of a laminating apparatus according to an exemplary embodiment of the present disclosure.

Referring to FIGS. 15 and 16, the laminating apparatus according to the present exemplary embodiment differs from the laminating apparatus according to the exemplary embodiment of FIG. 2 in that it further includes first and second chambers CH1 and CH2.

The first chamber CH1 defines a predetermined space and provides room for a first jig UJ and stoppers SP. In other words, the first jig UJ may be contained in the first chamber CH1.

The second chamber CH2 defines a predetermined space and provides room for a second jig LJ and panel supports PS.

Each of the first and second chambers CH1 and CH2 may have an aperture. That is, the first and second chambers CH1 and CH2 may be in communication with the outside air.

Referring to FIG. 15, in an initial state, the first and second chambers CH1 and CH2 may be spaced apart from each other. When the first and second chambers CH1 and CH2 are spaced apart from each other, a window W or a panel PA may be put in or out of the laminating apparatus according to the present exemplary embodiment.

Thereafter, referring to FIG. 16, the first and second chambers CH1 and CH2 may move close to each other and may then be coupled to each other. In a case in which the first and second chambers CH1 and CH2 are coupled, the space defined by the first and second chambers CH1 and CH2 may be sealed. In other words, a sealed space may be formed by coupling the first and second chambers CH1 and CH2.

That is, the initial state described above with reference to FIG. 6 may be realized in a sealed state.

Subsequent operations may be substantially the same as described above with reference to FIGS. 7 through 13.

Although not specifically illustrated in FIGS. 15 and 16, the laminating apparatus according to the present exemplary embodiment may further include a vacuum forming unit, which transforms the space defined by the first and second chambers CH1 and CH2 into a vacuum space.

In this case, a lamination process may be performed in a vacuum state.

Figure 17:
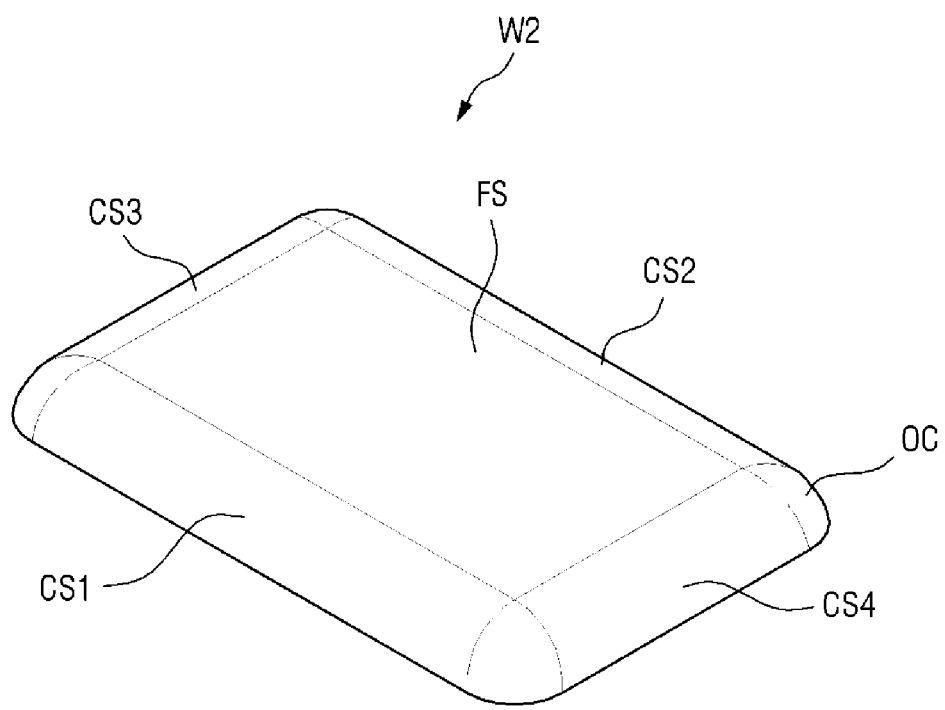
FIG. 17 is a partial perspective view of a laminating apparatus according to an exemplary embodiment of the present disclosure.

FIG. 17 is a partial perspective view of a laminating apparatus according to an exemplary embodiment of the present disclosure.

Referring to FIG. 17, the laminating apparatus according to the present exemplary embodiment differs from the laminating apparatus according to the exemplary embodiment of FIG. 1 in that a window W2 includes four curved surfaces.

In an exemplary embodiment, the window W2 may include four curved surfaces.

Two curved surfaces CS1 and CS2, which are disposed along the long sides of the window W2, may be substantially identical to the curved surfaces CS of the window W of FIG. 1.

In the present exemplary embodiment, unlike in the exemplary embodiment of FIG. 1, curved surfaces CS3 and CS4 may be additionally formed along the short sides of the window W2.

In an exemplary embodiment, the window W2 may further include connecting curved surfaces OC, which connect the curved surfaces disposed along the long sides of the window W2 and the curved surfaces disposed along the short sides of the window W2. In other words, the connecting curved surfaces OC may be placed in contact with one of the curved surfaces CS1 and CS2 at one side thereof and may be placed in contact with one of the curved surfaces CS3 and CS4 at the other side thereof.

In an exemplary embodiment, the window W2 may include four connecting curved surfaces OC, but the present disclosure is not limited thereto. That is, the window W2 may include less than four or more than four connecting curved surfaces OC.

Figure 18:
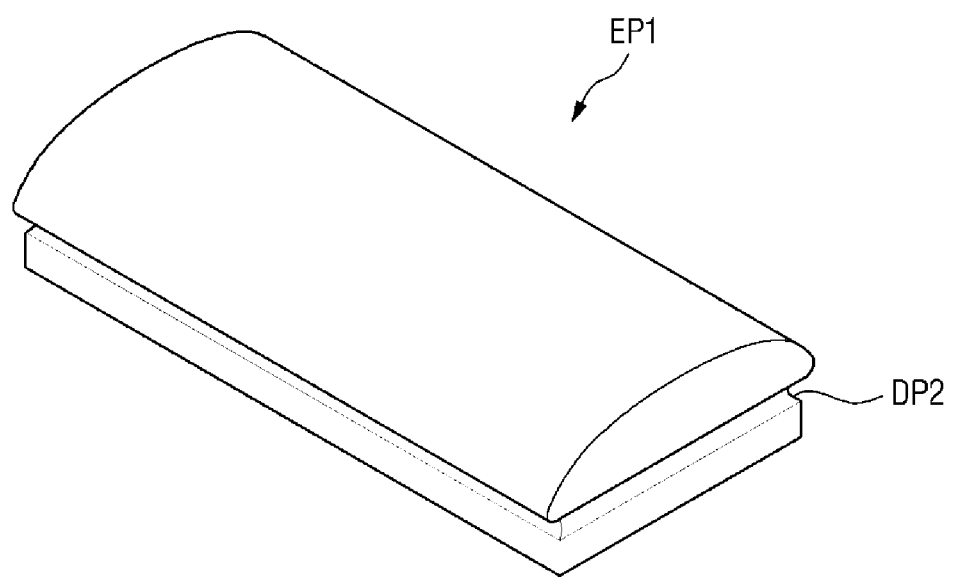
FIG. 18 is a partial perspective view of a laminating apparatus according to an exemplary embodiment of the present disclosure.

FIG. 18 is a partial perspective view of a laminating apparatus according to an exemplary embodiment of the present disclosure.

Referring to FIGS. 17 and 18, the window W2 may be formed to surround the sides of a pressure pad EP1.

That is, if the window W2 has four curved surfaces CS1, CS2, CS3, and CS4, as mentioned above, the pressure pad EP1 may include four depressed portions DP2 to correspond with the four curved surfaces CS1, CS2, CS3, and CS4, respectively.

In an exemplary embodiment, the depressed portions DP2, which are formed on the sides of the pressure pad EP1, may be connected to one another. That is, as illustrated in FIG. 19, depression lines DL2 of the depressed portions DP2 may form a closed figure in a plan view.

In a case in which the depressed portions DP2 of the pressure pad EP1 are formed to correspond with the curved surfaces of the window W2, the pressure at each of the curved surfaces of the window W2 may be controlled so as to make the bonding between the window W2 and an adhesive layer (not illustrated) uniform.

Figure 19:
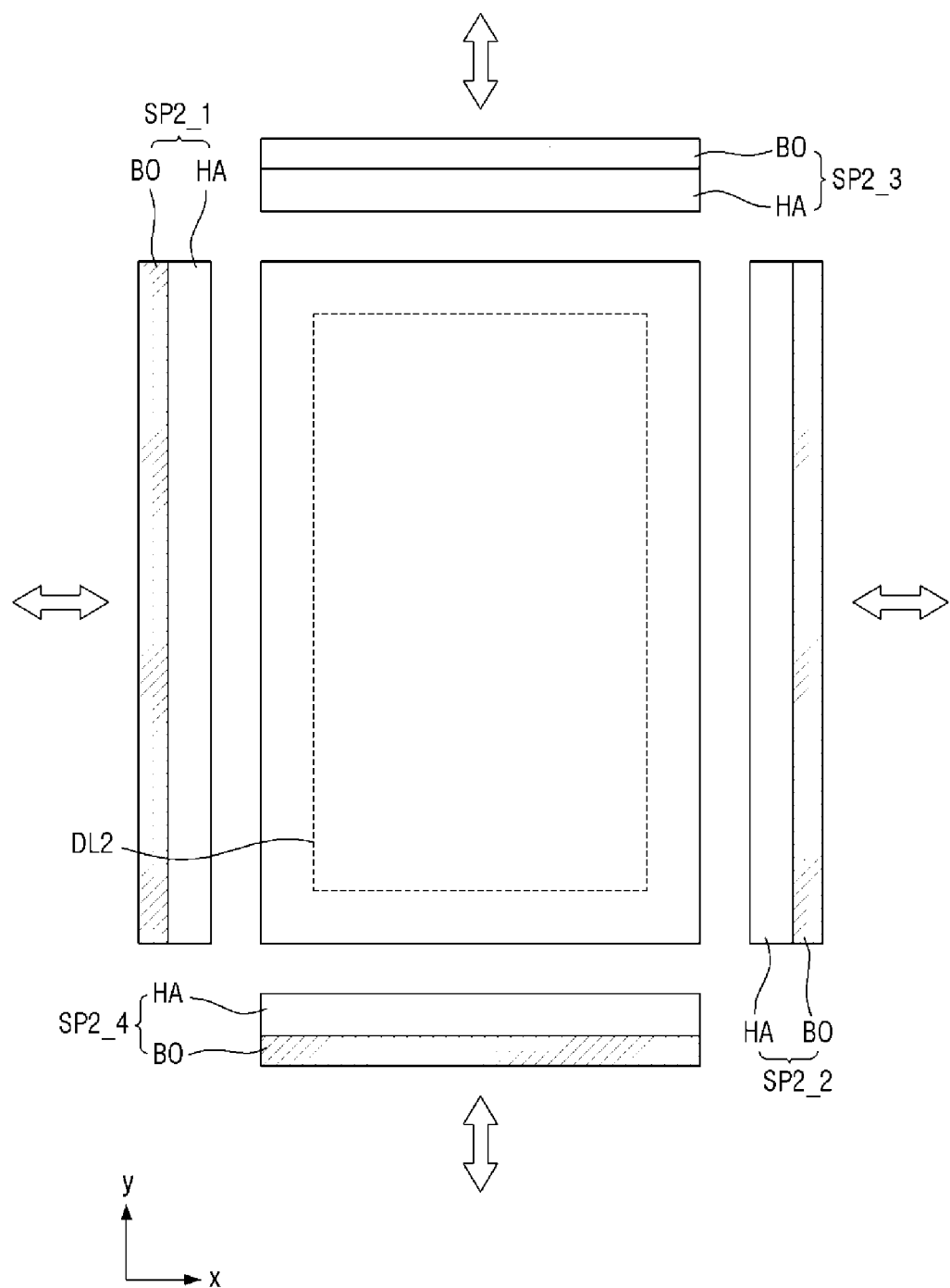
FIG. 19 is a partial plan view of a laminating apparatus according to an exemplary embodiment of the present disclosure.

FIG. 19 is a partial plan view of a laminating apparatus according to an exemplary embodiment of the present disclosure. Referring to FIG. 19, the laminating apparatus according to the present exemplary embodiment differs from the laminating apparatus according to the exemplary embodiment of FIG. 2 in that it includes four stoppers SP2_1, SP2_2, SP2_3, and SP2_4.

If a window W2 has four curved surfaces CS1, CS2, CS3, and CS4, as mentioned above, the four stoppers SP2_1, SP2_2, SP2_3, and SP2_4 may be provided to correspond with the four curved surfaces CS1, CS2, CS3, and CS4, respectively.

More specifically, the first and second stoppers SP2_1 and SP2_2 may be disposed to correspond with the long sides of the window W2. The first and second stoppers SP2_1 and SP2_2 may be substantially the same as the stoppers SP of FIG.

The laminating apparatus according to the present exemplary embodiment may further include the third and fourth stoppers SP2_3 and SP2_4, which correspond with the short sides of the window W2. The first through fourth stoppers SP2_1 through SP2_4 may perform substantially the same function as the stoppers SP of FIG. 1. That is, the first through fourth stoppers SP2_1 through SP2_4 may be disposed between the ends of the window W2 and the ends of a panel PA and may guide the bonding between the window W2 and the panel PA.

The first through fourth stoppers SP2_1 through SP2_4 may be horizontally movable.

In an exemplary embodiment, the first and second stoppers SP2_1 and SP2_2 may move in a positive X-axis direction or a negative X-axis direction, and the third and fourth stoppers SP2_3 and SP2_4 may move in a positive Y-axis direction or a negative Y-axis direction.

Figure 20:
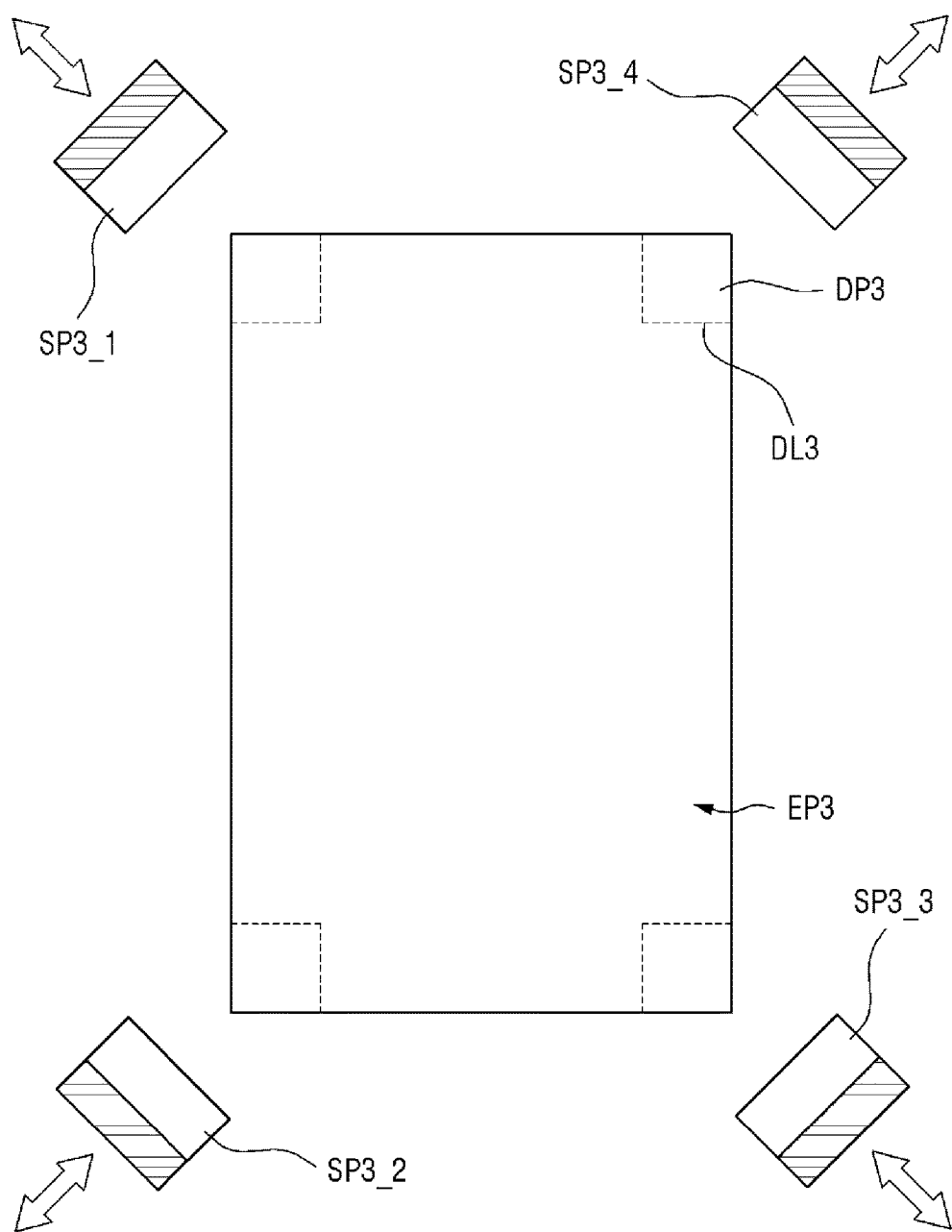
FIG. 20 is a plan view of a laminating apparatus according to an exemplary embodiment of the present disclosure.

FIG. 20 is a plan view of a laminating apparatus according to an exemplary embodiment of the present disclosure. Referring to FIG. 20, the laminating apparatus according to the present exemplary embodiment differs from the laminating apparatus according to the exemplary embodiment of FIG. 2 in that depressed portions DP3 are formed at the four corners of a pressure pad EP3.

As mentioned above, connecting curved surfaces OC may be formed at the four corners of a window W2. Each of the connecting curved surfaces OC connect two curved surfaces, and bubbles are highly likely to be injected into the connecting curved surfaces OC. In a case in which the depressed portions DP3 are formed at the four corners of the pressure pad EP3 to correspond with the connecting curved surfaces OC, the bonding between the connecting curved surfaces OC and a panel PA may become further uniform.

In an exemplary embodiment, first through fourth stoppers SP3_1, SP3_2, SP3_3, and SP3_4 may be disposed at locations corresponding to four depressed portions DP3.

The first through fourth stoppers SP3_1 through SP3_4 may be interposed between the ends of connecting curved surfaces OC and the corners of a panel PA and may guide the connecting curved surfaces OC and the panel PA to be bonded gradually.

In an exemplary embodiment, the first through fourth stoppers SP3_1 through SP3_4 may be diagonally movable. That is, the first through fourth stoppers SP3_1 through SP3_4 may move in a diagonal direction and may move close to, or away from, the pressure pad EP3.

In an exemplary embodiment, depression lines DL3 of the depressed portions DP3 may form a polygonal shape in a plan view.

Figure 21:
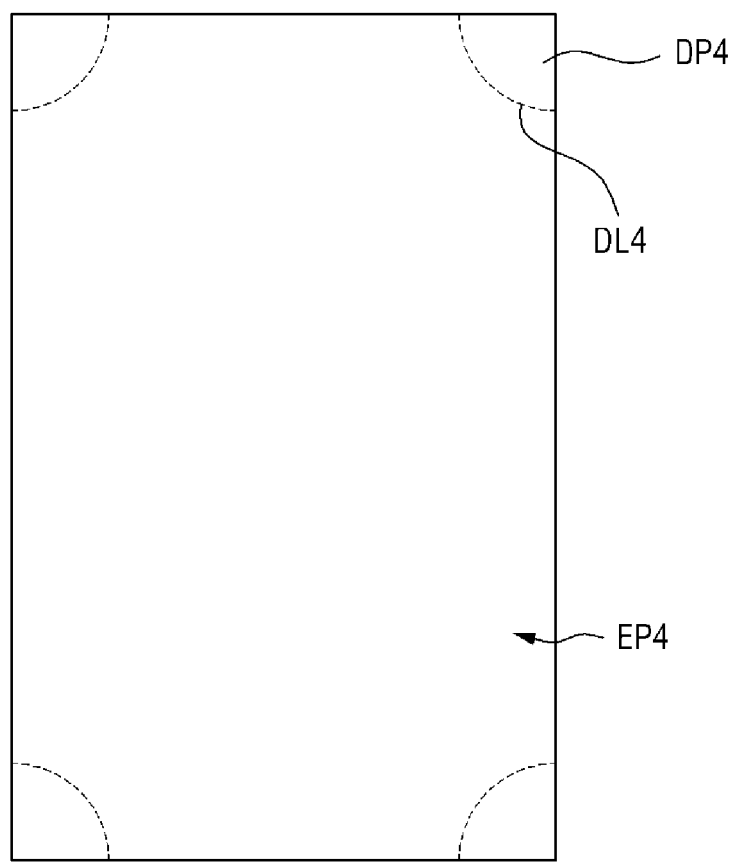
FIG. 21 is a plan view of a laminating apparatus modified from the laminating apparatus according to the exemplary embodiment of FIG. 20.

FIG. 21 is a plan view of a laminating apparatus modified from the laminating apparatus according to the exemplary embodiment of FIG. 20.

Referring to FIG. 21, the laminating apparatus according to the present exemplary embodiment differs from the laminating apparatus according to the exemplary embodiment of FIG. 20 in that depression lines DL4 of depressed portions DP4 of a pressure pad EP4 include curved lines.

In a case in which the depression lines DL4 of the depressed portions DP4 of the pressure pad EP4 include curved lines, the pressure applied to each location at a connecting curved surface OC may become relatively uniform.

A method of fabricating a display device according to an exemplary embodiment of the present disclosure will hereinafter be described. Throughout the present disclosure, like reference numerals refer to like elements, and thus, descriptions thereof will be omitted, or at least simplified.

The method of fabricating a display device includes: preparing a first jig UJ, which fixes a window W, a second jig LJ, which includes a pressure pad EP facing the first jig UJ and having a top surface US that is convex and depressed portions DP that are inwardly depressed from side surfaces SS, respectively, and a panel PA, which is disposed on the second jig LJ; gradually bonding the window W and the panel PA by applying pressure to the panel with the pressure pad EP; inserting stoppers SP between the window W and the panel PA to separate the ends of the window W and the ends of the panel PA from each other; and gradually bonding the window W and the panel PA by applying pressure to the panel PA with the pressure pad EP with the ends of the window W and the ends of the panel PA spaced apart from each other.

The method of fabricating a display device may be performed by any one of the laminating apparatuses according to the aforementioned exemplary embodiments of the present disclosure, but the present disclosure is not limited thereto.

First, the operation of preparing a first jig UJ, which fixes a window W, a second jig LJ, which includes a pressure pad EP facing the first jig UJ and having a top surface US that is convex and depressed portions DP that are inwardly depressed from side surfaces SS, respectively, and a panel PA, which is disposed on the second jig LJ, is performed.

The window W, the first jig UJ, the second jig LJ, the pressure pad EP, and the panel PA are the same as their respective counterparts of any one of the laminating apparatuses according to the aforementioned exemplary embodiments of the present disclosure, and thus, detailed descriptions thereof will be omitted. (See FIGS. 1 and 2).

Once the operation of preparing the first jig UJ, the second jig LJ, and the panel PA is complete, the initial state described above with reference to FIG. 6 may be established. In the initial state, the panel PA may be bent into an arch shape by pushing both ends of the panel PA inwardly with panel supports PS.

Thereafter, the operation of gradually bonding the window W and the panel PA by applying pressure to the panel PA with the pressure pad EP may be performed. In an exemplary embodiment, the pressure pad EP may be lifted in a Z-axis direction to apply pressure to the panel PA. In response to pressure being applied to the panel PA, the window W may be placed in line contact with an adhesive layer AD, which is disposed on the panel PA. That is, a contact line CL along which the window W and the adhesive layer AD are placed in contact with each other may be formed, as illustrated in FIG. 8, and may be expanded into a contact surface CF, as illustrated in FIG. 9, as the pressure pad EP continues to be lifted.

Thereafter, the operation of inserting stoppers SP between the window W and the panel PA to separate the ends of the window W from the ends of the panel PA may be performed. That is, by allowing the panel supports PS to move away from each other, the ends of the panel PA and the panel supports PS may be separated from each other. Accordingly, the ends of the panel PA may be lifted by a predetermined distance due to their elasticity, and as a result, the ends of the panel PA (particularly, the adhesive layer AD) and the stoppers SP may be placed in contact with each other.

The stoppers SP may push the ends of the panel PA inwardly such that the ends of the panel PA and the ends of the window W are not placed in contact with, but separated from, each other, as illustrated in FIG. 10.

In another exemplary embodiment, the stoppers SP may push the ends of the panel PA inwardly such that the ends of the panel PA are located on the inner sides of the depressed portions DP, respectively, as illustrated in FIG. 11.

Thereafter, the operation of gradually bonding the window W and the panel PA by applying pressure to the panel PA with the pressure pad EP with the ends of the window W and the ends of the panel PA spaced apart from each other may be performed. That is, as the pressure pad EP continues to apply pressure to the panel PA, the window W and the panel PA may be gradually bonded together.

In an exemplary embodiment, in response to the width of the contact surface CF exceeding the distance between vertical boundaries BL_V, the stoppers SP may be removed. That is, the stoppers SP and the panel PA may be separated from each other, as illustrated in FIG. 12.

Thereafter, an operation of completely bonding the window W and the panel PA together by continuously applying pressure to the panel PA with the pressure pad EP may be performed, as illustrated in FIG. 13.

As a result, the window W and the panel PA may be completely bonded together, and the top surface US of the pressure pad EP may include a flat portion and curved portions and may conform to the shape of the window W or the panel PA.

However, the effects of the inventive concept are not restricted to the one set forth herein. The above and other effects of the inventive concept will become more apparent to one of daily skill in the art to which the inventive concept pertains by referencing the claims.

While the inventive concept has been particularly illustrated and described with reference to exemplary embodiments thereof, it will be understood by those of ordinary skill in the art that various changes in form and detail may be made therein without departing from the spirit and scope of the inventive concept as defined by the following claims. The exemplary embodiments should be considered in a descriptive sense only and not for purposes of limitation.

What is claimed is:

1. A laminating apparatus, comprising:
   a first jig, which is configured to fix a window having curved surfaces;
   a second jig, which includes a pressure pad facing the first jig,
   wherein the pressure pad includes a top surface, which is convex toward the first jig, and depressed portions, which are inwardly depressed from side surfaces, respectively, wherein the window includes a flat surface and the curved surfaces, which are disposed at both sides of the flat surface;
   a panel disposed on the second jig; and
   stoppers configured to be disposed between ends of the panel and ends of the window, wherein the stoppers are configured to push the ends of the panel inwardly such that the ends of the panel are located on inner sides of the depressed portions, respectively.

2. The laminating apparatus of claim 1, wherein the curved surfaces extend in a longitudinal direction, and the depressed portions extend in the longitudinal direction to correspond with the curved surfaces.

3. The laminating apparatus of claim 1, further comprising:
   panel supports configured to be disposed on both sides of the panel.

4. The laminating apparatus of claim 3, wherein the panel supports are configured to bend the panel by pushing the ends of the panel inwardly.

5. The laminating apparatus of claim 1, further comprising:
   a stage on which the pressure pad is disposed.

6. The laminating apparatus of claim 5, wherein the pressure pad and the stage are disposed in one body with each other.

7. The laminating apparatus of claim 1, wherein the pressure pad further includes protruding portions, which are disposed on outer sides of the side surfaces, respectively.

8. The laminating apparatus of claim 1, further comprising:
   first and second chambers containing the first and second jigs, respectively.

9. The laminating apparatus of claim 8, wherein the first and second chambers are configured to be coupled to each other and form a sealed space together.

10. A laminating apparatus, comprising:
    a first jig, which is configured to fix a window having curved surfaces;
    a second jig, which includes a pressure pad facing the first jig,
    wherein the pressure pad includes a top surface, which is convex toward the first jig, and depressed portions, which are inwardly depressed from side surfaces, respectively, wherein the window includes a flat surface and the curved surfaces, which are disposed at both sides of the flat surface;
    a panel disposed on the second jig; and
    stoppers configured to be disposed between ends of the panel and ends of the window, wherein
    the stoppers include body portions, respectively, and hand portions, respectively, which extend from the body portions, and
    a coating layer is disposed on each of the hand portions.

11. A laminating apparatus, comprising:
    a first jig, which is configured to fix a window having curved surfaces; and
    a second jig, which includes a pressure pad facing the first jig,
    wherein the pressure pad includes a top surface, which is convex toward the first jig, and depressed portions, which are inwardly depressed from side surfaces, respectively, wherein the window includes a flat surface and first, second, third, and fourth curved surfaces, which are disposed on the sides of the flat surface.

12. The laminating apparatus of claim 11, wherein
    the depressed portions include depression lines, and
    the depression lines form a closed polygonal shape in a plan view.

13. The laminating apparatus of claim 11, wherein the window further includes four connecting curved surfaces, which connect the first, second, third, and fourth curved surfaces.

14. The laminating apparatus of claim 13, wherein the depressed portions are disposed at corners, respectively, of the pressure pad to correspond with the four connecting curved surfaces.

15. The laminating apparatus of claim 14, further comprising:
first, second, third, and fourth stoppers disposed adjacent to the four connecting curved surfaces.

16. The laminating apparatus of claim 11, further comprising:
first, second, third, and fourth stoppers disposed to correspond with the first, second, third, and fourth curved surfaces, respectively.

17. A method of fabricating a display device, comprising:
preparing a first jig, which fixes a window, a second jig, which includes a pressure pad facing the first jig and having a top surface that is convex and depressed portions that are inwardly depressed from side surfaces, respectively, and a panel, which is disposed on the second jig;
gradually bonding the window and the panel by applying pressure to the panel with the pressure pad;
inserting stoppers between the window and the panel to separate ends of the window and ends of the panel from each other such that the ends of the panel are located on inner sides of the depressed portions, respectively; and
gradually bonding the window and the panel by applying pressure to the panel with the pressure pad with the ends of the window and the ends of the panel spaced apart from each other.

18. The method of claim 17, further comprising:
bending the panel by pushing the ends of the panel inwardly with panel supports.

19. A laminating apparatus, comprising:
a first jig, which is configured to fix a window having curved surfaces;
a second jig, which includes a pressure pad facing the first jig; and
a panel disposed on the second jig,
wherein the pressure pad includes a top surface, which is convex toward the first jig, and depressed portions, which are inwardly depressed from side surfaces, respectively, and
wherein the depressed portions are configured to insert ends of the panel.

* * * * *